(12) United States Patent
Lee (10) Patent No.: US 7,586,794 B2
(45) Date of Patent: Sep. 8, 2009

(54) METHODS OF READING DATA INCLUDING COMPARING CURRENT AND PREVIOUS SECTION ADDRESSES AND RELATED DEVICES

(75) Inventor: Seungwon Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 77 days.

(21) Appl. No.: 11/959,539

(22) Filed: Dec. 19, 2007

(65) Prior Publication Data

US 2008/0279002 A1    Nov. 13, 2008

(30) Foreign Application Priority Data

May 10, 2007   (KR) .................... 10-2007-0045567

(51) Int. Cl.
*G11C 7/00*   (2006.01)
*G11C 16/04*   (2006.01)

(52) U.S. Cl. ..................... 365/189.07; 365/185.05; 365/189.05

(58) Field of Classification Search ............. 365/189.17
See application file for complete search history.

(56) References Cited

U.S. PATENT DOCUMENTS

| | | | |
|---|---|---|---|
| 5,696,917 A | | 12/1997 | Mills et al. |
| 5,781,483 A | | 7/1998 | Shore |
| 6,175,535 B1 | * | 1/2001 | Dhong et al. ............... 365/236 |
| 6,449,193 B1 | * | 9/2002 | Love et al. ............. 365/230.09 |
| 6,504,196 B1 | | 1/2003 | Rhodes |
| 6,862,242 B2 | * | 3/2005 | Chen ......................... 365/227 |
| 7,068,253 B2 | | 6/2006 | Kudo et al. |
| 7,184,306 B2 | | 2/2007 | Conley et al. |

(Continued)

FOREIGN PATENT DOCUMENTS

EP    1315090 A1    5/2003

(Continued)

OTHER PUBLICATIONS

United Kingdom Search Report corresponding to UK Patent Application No. GB0808570.6, Dated Jul. 15, 2008 (2 Pages).

*Primary Examiner*—Tan T. Nguyen
(74) *Attorney, Agent, or Firm*—Myers Bigel Sibley & Sajovec, P.A.

(57) ABSTRACT

A memory device may include a memory cell array arranged in a plurality of sections of memory cells, with each section of memory cells including a plurality of sub-sections of memory cells. Operation of the memory device may include providing a current memory address for a current read operation from a controller, and the current memory address may include a current section address portion and a current sub-section address portion. The current section address portion and a previous section address portion of a previous read operation may be compared. When the current and previous section address portions are different, a wait signal may be enabled at the controller. While enabling the wait signal at the controller, a section of data may be copied from the memory cell array to a section buffer, with the section of data being copied from a section of memory cells defined by the current section address portion of the current memory address. After copying the section of data to the section buffer, a sub-section of the data from the section of data in the section buffer may be transmitted to the controller. Related systems and devices are also discussed.

25 Claims, 9 Drawing Sheets

U.S. PATENT DOCUMENTS

| | | |
|---|---|---|
| 7,184,314 B2 | 2/2007 | Hosono et al. |
| 7,190,615 B2 | 3/2007 | Fujito et al. |
| 7,269,047 B1 * | 9/2007 | Fong et al. .................. 365/104 |
| 2004/0186949 A1 | 9/2004 | Liu et al. |
| 2004/0205301 A1 | 10/2004 | Hara et al. |
| 2005/0228962 A1 | 10/2005 | Takase et al. |
| 2006/0020764 A1 | 1/2006 | Kim et al. |

FOREIGN PATENT DOCUMENTS

| | | |
|---|---|---|
| EP | 1 619 588 A1 | 1/2006 |
| EP | 1619588 A1 | 1/2006 |
| EP | 1835506 A1 | 9/2007 |
| JP | 09-270190 | 10/1997 |
| JP | 10-2004-0025379 | 10/2004 |
| JP | 10-2004-7015747 | 11/2004 |
| KR | 10-2004-0097272 | 10/2002 |
| KR | 1020040089581 A | 10/2004 |
| KR | 1020070064714 | 6/2007 |
| WO | WO 03/085676 A1 | 10/2003 |
| WO | WO 03/085677 A1 | 10/2003 |

* cited by examiner

METHODS OF READING DATA INCLUDING COMPARING CURRENT AND PREVIOUS SECTION ADDRESSES AND RELATED DEVICES

RELATED APPLICATIONS

This U.S. non-provisional patent application claims the benefit of priority under 35 U.S.C. § 119 of Korean Patent Application No. 10-2007-0045567, filed on May 10, 2007, the disclosure of which is hereby incorporated herein by reference in its entirety.

FIELD OF THE INVENTION

The present invention generally relates to electronic memories, and more particularly, to methods of reading data from electronic memories and related devices.

BACKGROUND

Flash memories may be configured as NOR flash memories or as NAND flash memories. In a NOR flash memory, the memory cells are connected to the bit lines in parallel so that if any memory cell is turned on by the corresponding wordline, the bit line goes low. In a NAND flash memory, a number of transistors are connected in series so that a NAND flash memory structure may provide a higher density of memory cells than may be provided in a NOR flash memory. Moreover, NAND flash memories may provide faster programming and erasing times than may be provided by NOR flash memories.

Read operations for NAND flash memories are discussed, for example, in European Patent Publication No. EP 1619588 A1 to Bennett (the Bennett publication). In particular, an address may be received from a CPU and held in a requested address register. The address of a current access being made to NAND flash may be held in a current address register. The page address in the address received from the CPU may be read and compared with the current page that is being accessed from the NAND flash memory. If the requested page is not the same at the current page, then a decision is made to generate a random read to the NAND flash memory by providing the requested page address. The page address in the current address register is updated to reflect the new requested page address. The byte address in the current register is updated to read byte zero (or the first byte in the segment of the page which is being addressed when the NAND flash memory is being operated in different read modes). The read operation described above is then completed and data for the addressed page is placed in the data register to be read out byte-by-byte under control of RE pulses. As each byte is read out, the byte address is updated in the current register.

SUMMARY

According to some embodiments of the present invention, a memory device may include a memory cell array arranged in a plurality of sections of memory cells, with each section of memory cells including a plurality of sub-sections of memory cells. Operation of the memory device may include providing a current memory address for a current read operation from a controller, with the current memory address including a current section address portion and a current sub-section address portion. The current section address portion and a previous section address portion of a previous read operation may be compared, and when the current and previous section address portions are different, a wait signal may be enabled at the controller. While enabling the wait signal at the controller, a section of data from the memory cell array may be copied to a section buffer wherein the section of data is copied from a section of memory cells defined by the current section address portion of the current memory address. After copying the section of data to the section buffer, a sub-section of the data may be transmitted from the section of data in the section buffer to the controller. After copying the section of data to the section buffer and before transmitting the sub-section of the data, the wait signal may be disabled at the controller.

When the current and previous section address portions are the same, the wait signal may be disabled. Moreover, a section of data from the previous read operation may be maintained in the section buffer, and a sub-section of the data in the section buffer may be transmitted from the section buffer while disabling the wait signal at the controller. Responsive to enabling the wait signal, a clock signal may be masked at the controller when the previous section address portion and the current section address portion are different, and responsive to disabling the wait signal, the clock signal may be unmasked at the controller when the previous section address portion and the current section address portion are the same. Masking the clock signal may include combining the enabled wait signal with an input clock signal at a logic gate so that no clock signal is provided at an output of the logic gate responsive to enabling the wait signal, and unmasking the clock signal may include combining the disabled wait signal with the input clock signal at the logic gate so that an output clock signal is provided at the output of the logic gate responsive to disabling the wait signal. More particularly, the logic gate may include an AND gate, a NAND gate, an OR gate, and/or a NOR gate.

Each section of memory cells in the memory cell array may include a page of memory cells, and each sub-section of memory cells may include a byte of memory cells. Before providing the current memory address for the current read operation, the previous section address portion of the previous read operation may be saved in a previous address register, and when the current and previous section address portions are different, the current section address portion may be copied to the previous address register. The memory cell array may include an integrated circuit memory cell array on a semiconductor substrate, comparing the current and previous section address portions may include comparing the current and previous section address portions using a comparison circuit, and the comparison circuit may be provided on the semiconductor substrate.

The memory cell array may include a plurality of strings of memory cells with each string including a plurality of memory cell transistors serially coupled between a string selection transistor and a ground selection transistor. Moreover, a section of memory cells of the memory cell array may include a plurality of memory cell transistors of different strings electrically coupled to a same wordline. The memory cell array include a plurality of memory cell transistors arranged in rows and columns, each memory cell transistor may be electrically coupled between a bit line and a source line, and a control electrode of each memory cell transistor may be electrically coupled to a wordline. A section of memory cells of the memory cell array may include a plurality of memory cell transistors having control electrodes electrically coupled to a same wordline.

In addition, if the current read operation is a first read operation after providing power to the memory device, the wait signal may be enabled at the controller. While enabling the wait signal at the controller, a section of data from the memory cell array may be copied to a section buffer, with the section of data being copied from a section of memory cells defined by the current section address portion of the current memory address. After copying the section of data to the section buffer, a sub-section of the data may be transmitted from the section of data in the section buffer to the controller.

According to some other embodiments of the present invention, an electronic device may include a memory cell array, a section buffer electrically coupled to the memory cell array, and a controller electrically coupled to the memory cell array and the section buffer. The memory cell array may be arranged in a plurality of sections of memory cells, with each section of memory cells including a plurality of sub-sections of memory cells. The section buffer may be configured to store a section of data read from a section of memory cells of the memory cell array. The controller may be configured to receive a current memory address for a current read operation with the current memory address including a current section address portion and a current sub-section address portion, and to mask a clock signal at the controller when the current section address portion and a previous section address portion from a previous read operation are different. In addition, the section buffer may be configured to copy a section of data from the memory cell array while the clock signal of the memory controller is masked, and the section of data may be copied from a section of memory cells defined by the current section address portion of the current memory address. The section buffer may also be configured to transmit a sub-section of the data from the section of data in the section buffer after the section of data is copied to the section buffer.

A comparison circuit may be electrically coupled to the controller, with the comparison circuit being configured to compare the current section address portion with the previous section address portion of a previous read operation. The comparison circuit may also be configured to enable or disable a wait signal responsive to the comparison, and the controller may be configured to mask or unmask the clock signal responsive to the wait signal. The memory cell array may include an integrated circuit memory cell array on a semiconductor substrate, and the comparison circuit may be provided on the semiconductor substrate.

The clock signal may be unmasked at the controller after copying the section of data to the section buffer and before transmitting the sub-section of the data. The section buffer may be configured to maintain a section of data from the previous read operation in the section buffer and to transmit a sub-section of the data in the section buffer without masking the clock signal at the controller when the current and previous section address portions are the same.

The clock signal may be masked at the controller by enabling a wait signal when the previous section address portion and the current section address portion are different and masking the clock signal at the controller responsive to the enabled wait signal. The controller may be configured to mask the clock signal by combining the enabled wait signal with an input clock signal at a logic gate so that no clock signal is provided at an output of the logic gate when the enabled wait signal is provided, and so that an output clock signal is provided at an output of the logic gate when the wait signal is disabled. More particularly, the logic gate may include an AND gate, a NAND gate, an OR gate, and/or a NOR gate.

Each section of memory cells in the memory cell array may include a page of memory cells, and each sub-section of memory cells may include a byte of memory cells. A previous address register may be configured to save the previous section address portion of the previous read operation before the current memory address for the current read operation is provided, and to copy the current section address portion to the previous address register when the current and previous section address portions are different.

The memory cell array may include a plurality of strings of memory cells with each string including a plurality of memory cell transistors serially coupled between a string selection transistor and a ground selection transistor. A section of memory cells of the memory cell array may include a plurality of memory cell transistors of different strings electrically coupled to a same wordline.

The memory cell array may include a plurality of memory cell transistors arranged in rows and columns, and each memory cell transistor may be electrically coupled between a bit line and a source line, and a control electrode of each memory cell transistor may be electrically coupled to a wordline. More particularly, a section of memory cells of the memory cell array may include a plurality of memory cell transistors having control electrodes electrically coupled to a same wordline.

The controller may be configured to determine if the current read operation is a first read operation after providing power to the memory device, and to mask a clock signal at the controller when the current read operation is a first read operation after providing power to the memory device. The section buffer may be configured to copy a section of data from the memory cell array to a section buffer wherein the section of data is copied from a section of memory cells defined by the current section address portion of the current memory address while masking the clock signal of the controller, and to transmit a sub-section of the data from the section of data in the section buffer to the controller after copying the section of data to the section buffer.

An interface may be electrically coupled to the controller with the interface providing a detachable electrical and mechanical coupling with a microprocessor. A radio interface may be electrically coupled to the controller with the radio interface providing a wireless coupling with a microprocessor. A bus may be electrically coupled to the controller, and a microprocessor may be electrically coupled to the bus, with the controller being configured to provide data from the memory cell array over the bus to the microprocessor. A user interface may be electrically coupled to the bus, with the user interface being configured to provide data to the microprocessor and to receive data from the microprocessor.

According to still other embodiments of the present invention, an electronic device may include a memory cell array, a section buffer electrically coupled to the memory cell array, and a controller electrically coupled to the memory cell array and the section buffer. The memory cell array may be arranged in a plurality of strings of memory cells with each string including a plurality of memory cell transistors serially coupled between a string selection transistor and a ground selection transistor with a plurality of memory cell transistors of different strings defining a section and with each section including a plurality of sub-sections of memory cells transistors. The section buffer may be configured to store a section of data read from a section of memory cells of the memory cell array. The controller may be configured to receive a current memory address for a current read operation from a memory controller with the current memory address including a current section address portion and a current sub-section address portion, and to mask a clock signal at the controller when the current section address portion and a previous section address portion from a previous read operation are different. The section buffer may also be configured to copy a section of data from the memory cell array while the clock signal of the memory controller is masked with the section of data being copied from a section of memory cells defined by the current section address portion of the current memory address. The section buffer may be further configured to transmit a sub-section of the data from the section of data in the section buffer after the section of data is copied to the section buffer.

A comparison circuit may be electrically coupled to the controller with the comparison circuit being configured to compare the current section address portion with a previous section address portion of a previous read operation. The comparison circuit may be further configured to enable or disable a wait signal responsive to comparing the current and previous section address portions and the controller may be further configured to mask or unmask the clock signal responsive to the wait signal. The memory cell array may also include an integrated circuit memory cell array on a semiconductor substrate, and the comparison circuit may be provided on the semiconductor substrate.

The section buffer may be configured to maintain a section of data from the previous read operation in the section buffer and to transmit a sub-section of the data in the section buffer without masking the clock signal at the controller when the current and previous section address portions are the same. Moreover, each section of memory cells in the memory cell array may include a page of memory cells, and each sub-section of memory cells may include a byte of memory cells.

DETAILED DESCRIPTION

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 1:
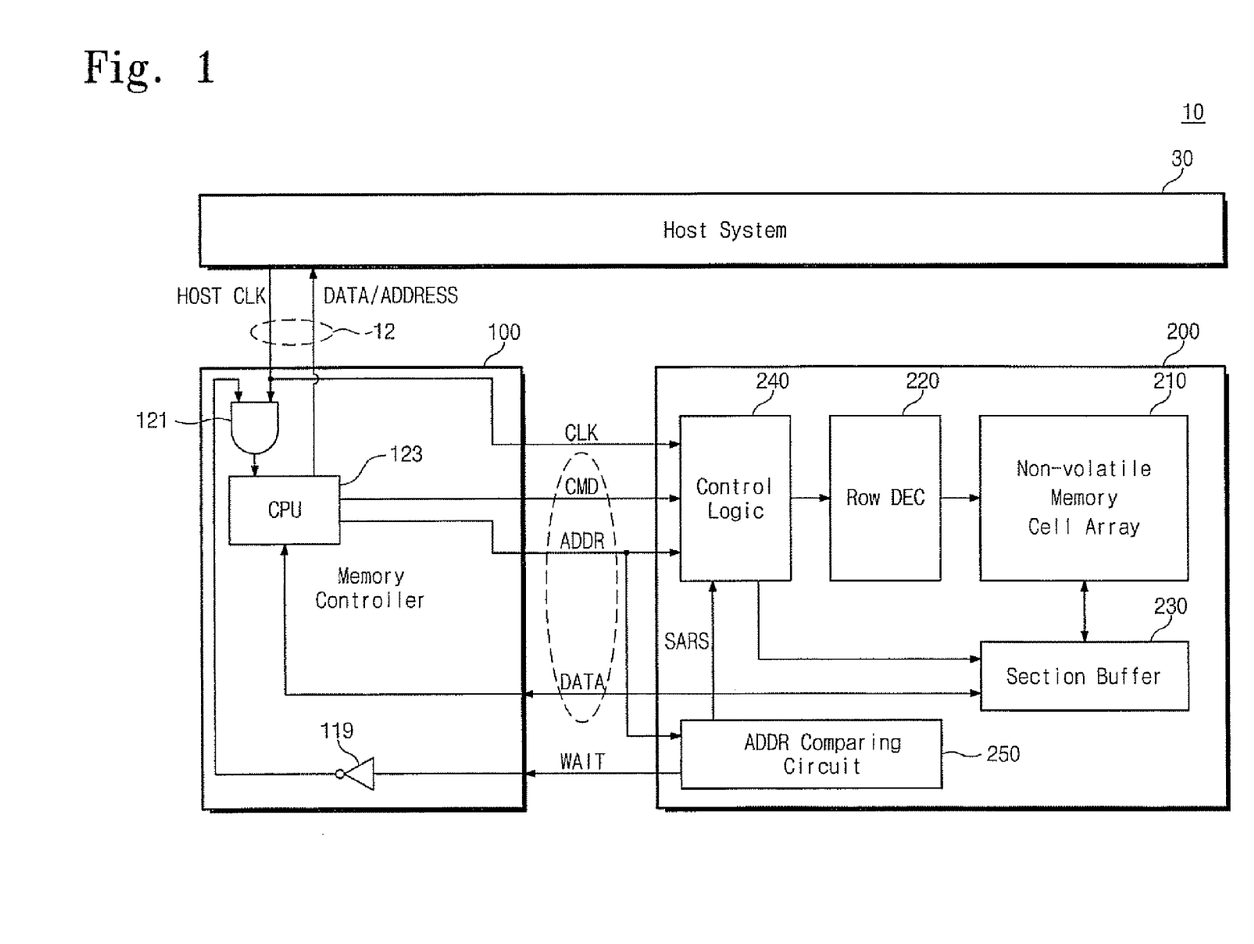
FIG. 1 is a block diagram illustrating electronic memory systems according to embodiments of the present invention.

FIG. 1 is a block diagram illustrating an electronic system 10 according to embodiments of the present invention. The system 10 may include a memory controller 100 and a memory block 200, and the memory block 200 may include a non-volatile memory cell array 210, a row decoder 220, a section buffer 230, control logic 240, and an address comparing circuit 250. The memory controller 100 may also be configured to communicate with a host system 30 over a data bus 12. More particularly, the memory controller may be configured to communicate data/address information DATA/ADDRESS over the bus 12 and to receive a host clock signal HOST CLK over the bus 12.

Figure 2A:
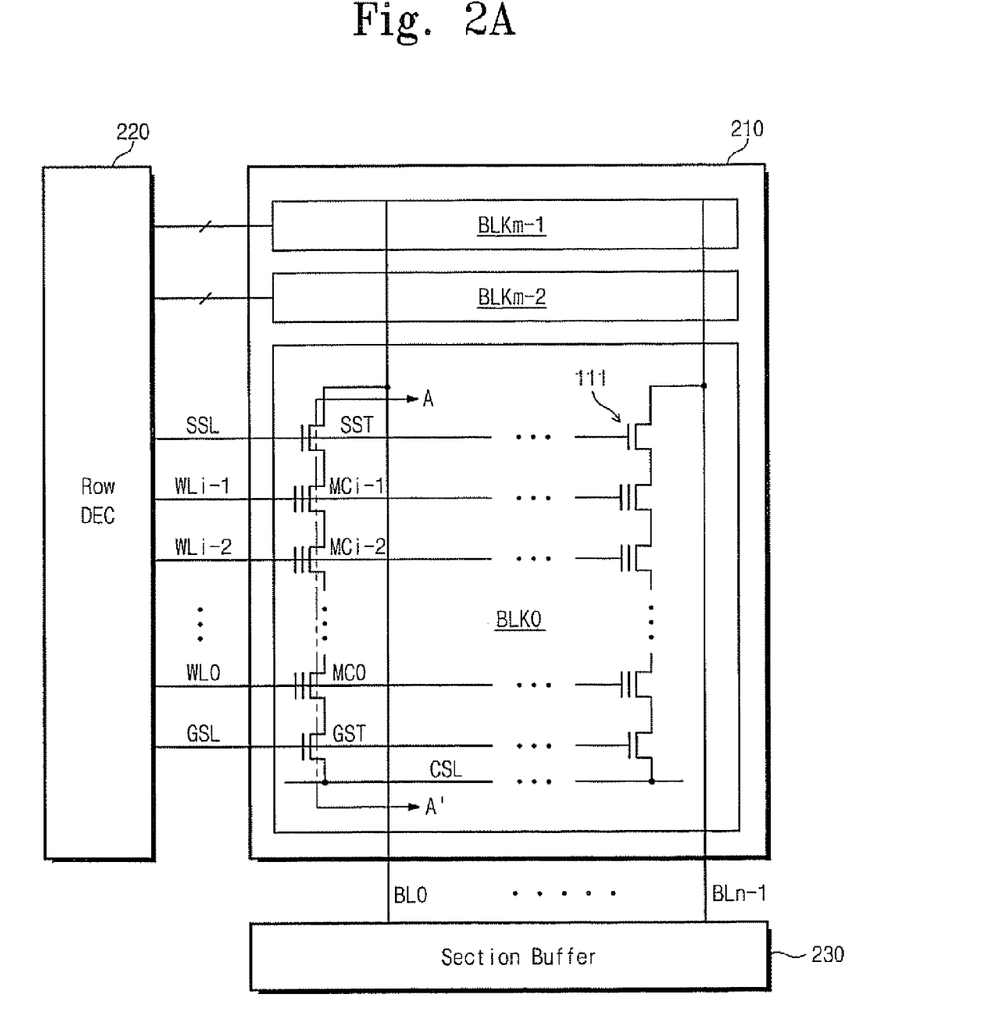
FIG. 2A is a schematic diagram illustrating in greater detail a non-volatile memory cell array of FIG. 1 according to embodiments of the present invention.
Figure 2B:
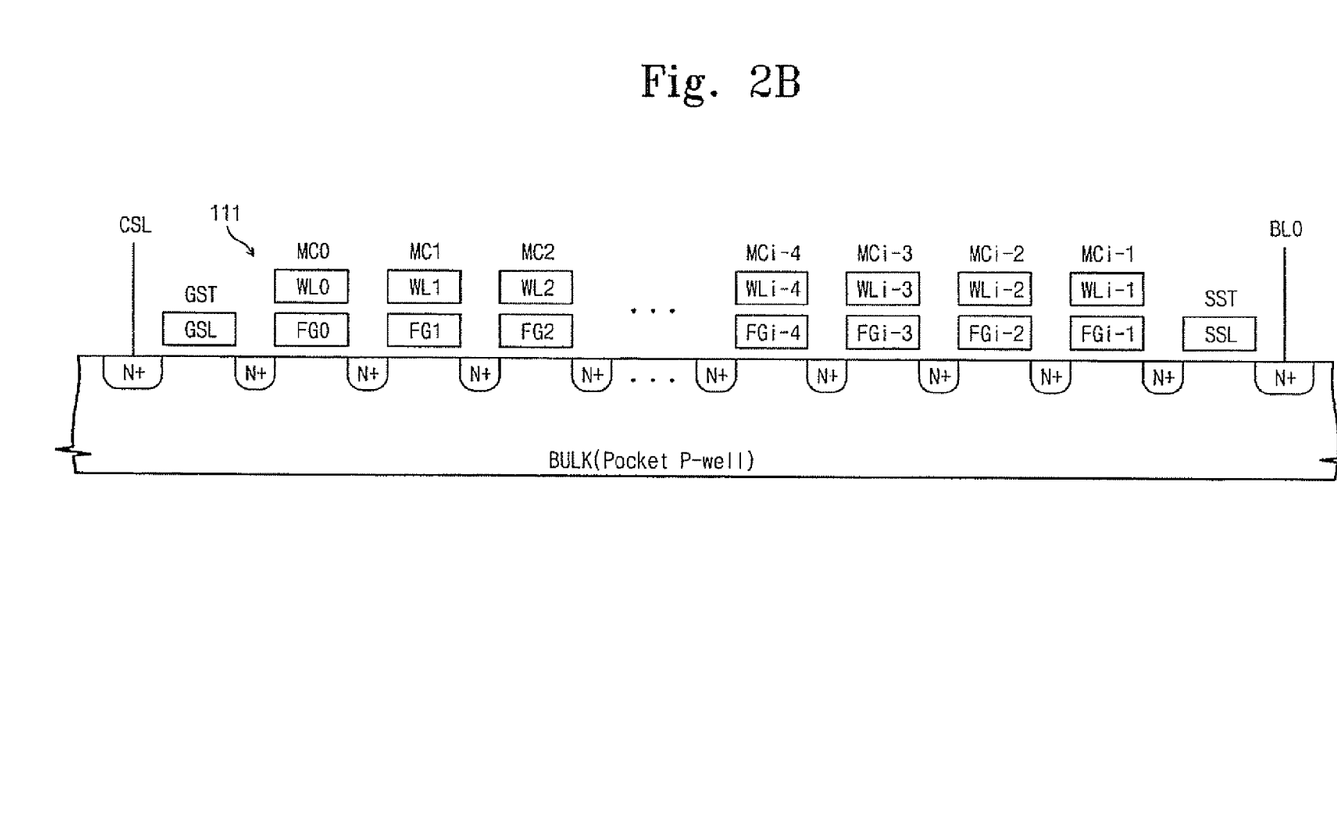
FIG. 2B is a cross-sectional view of a string of non-volatile memory cell transistors taken along section line A-A' of FIG. 2A.

The non-volatile memory cell array 210 may include a plurality of blocks BLK0 to BLKm−1 (where m is the number of blocks) of memory cell transistors, and each block may include a plurality of strings of memory cell transistors connected to respective bit lines BL0 to BLn−1 (where n is the number of bit lines), as shown in FIGS. 2A and 2B. More particularly, each string of memory cell transistors may include a plurality of memory cell transistors MC0 to MCi−1 (where i is the number of memory cell transistors in a string) electrically coupled in series between a string selection transistor SST and a ground selection transistor GST.

The string selection transistor SST provides electrical coupling/decoupling between the string and a respective bit line BL, and the ground selection transistor GST provides electrical coupling/decoupling between the string and a common source line CSL for the block. Moreover, memory cell transistors of different strings in respective rows are electrically coupled to the row decoder 220 through respective wordlines WL0 to WLi−1, string selection transistors SST of different strings in a same block are connected to the row decoder 220 through a string selection line SSL, and ground selection transistors GST of different strings in a same block are connected to the row decoder 220 through a ground selection line GSL. Moreover, string selection transistors of different blocks are coupled to the section buffer 230 through respective bit lines BL0 to BLn−1.

Ground selection line GSL may thus provide control gate electrodes for respective ground selection transistors GST of a block, and string selection line SSL may provide control gate electrodes for respective string selection transistors SST. Each memory cell access transistor may include a control gate electrode provided by a respective wordline WL0 to WLi−1 and a floating gate FG0 to FGi−1 between the control gate electrode and a p-well of the semiconductor substrate. Moreover, each row of memory cell transistors connected to a same wordline may define a section of memory cells (such as a page of memory cells), and each section of memory cells may include a plurality of sub-sections of memory cells (such as a plurality of bytes of memory cells). Non-volatile NAND-type flash memory structures are discussed, for example, in European Patent Publication EP 1619588, the disclosure of which is hereby incorporated herein in its entirety by reference. Moreover, each memory cell transistors MC0 to MCi−1 of a string may include a tunnel insulating layer between the floating gate and the substrate, a dielectric layer between the wordline and the floating gate, and source/drain regions in the semiconductor substrate on opposite sides of the floating gate.

During a section read operation, data from a row of memory cells may be copied into the section buffer 230 responsive to wordline, ground selection line, and string selection line signals generated by row decoder 220 and/or control logic 240. If a row of memory cell transistors defines a page of memory cell transistors, the section read operation may be referred to as a page read operation, and the section buffer 230 may be referred to as a page buffer.

In the system 10 of FIGS. 1, 2A, and 2B, a section (such as a page) of data may be copied from a section of memory cell transistors of the non-volatile memory cell array 210 to the section buffer 230. Individual subsections (such as individual bytes) of the section may then be copied from the section buffer 230 to the memory controller 100 and/or the host system 30. Individual subsections of data can thus be copied more quickly from the section buffer 230 to the memory controller 100 and/or the host system 30 during a read operation than a section of data can be copied from the non-volatile memory cell array to the section buffer 230.

Figure 3:
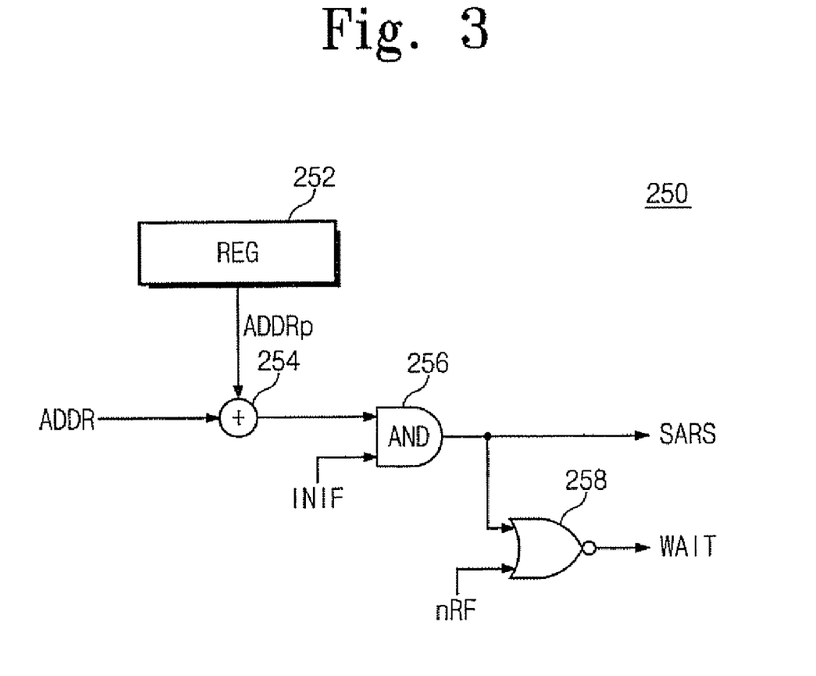
FIG. 3 is a schematic diagram illustrating in greater detail an address comparing circuit of FIG. 1 according to embodiments of the present invention.

During a read operation, a current memory address for a current read operation may be received at the controller 100 from the host system 30, and the current memory address or portions thereof may be provided by the controller 100 to the control logic 240 and to the address comparing circuit 250 of the memory block 200. The current memory address may include a current section address portion (such as a page address portion) and a current sub-section address portion (such as a byte address portion). As shown in FIG. 3, the address comparing circuit may include a register 252 storing a previous section address portion of a previous read operation. More particularly, the previous section address portion stored in the register 252 corresponds to a section of data in the section buffer from a previous read operation.

The current section address portion provided by the memory controller for the current read operation and the previous section address portion of the previous read operation in the register 252 may then be compared at comparator 254 to determine if the current and previous section address portions are the same or different. If the current and previous section address portions are the same, a subsection of data defined by the current subsection address portion may be copied from the section buffer 230 to the memory controller 100 and/or the host system 30 without performing a section read operation to copy a section of data from non-volatile memory cell array 210. If the current and previous section address portions are different, a section of data defined by the current section address portion may be copied from the non-volatile memory cell array 210 to the section buffer 230 before coping a subsection of data defined by the current subsection address portion from the section buffer 230 to the memory controller 100 and/or the host system 30. In particular, the control logic 240 and/or the row decoder 220 may generate the appropriate string selection line, ground selection line, and wordline signals for the read operation responsive to clock CLK, command CMD, and/or address ADDR signals received from the controller 100.

As long as current and previous section address portions are the same for successive read operations, a section of data may be copied once from the non-volatile memory cell array 210 to the section buffer 230, and different subsections of data may be copied from the section buffer 230 for the successive subsection read operations. Because data can be copied relatively quickly from the section buffer, successive read operations from a same section of data may be performed synchronously by copying the subsections of data from the section buffer 230 without copying from the non-volatile memory cell array for each read operation.

When the current and previous section address portions are the same, the comparator may generate a binary "H" (or "1") value so that the SARS signal has a binary "H" value and the WAIT signal has a binary "L" (or "0") value. Stated in other words, the WAIT signal may be disabled at the controller 100 so that the host clock signal HOST CLK is provided through a masking logic circuit (for example, including inverter 119 and AND gate 121) to a central processing unit (CPU) of the memory controller 100. Synchronous read operations may thus be provided at a relatively high speed as long as successive read operations specify a same current section address portion. In response to the SARS signal having the binary "H" value, the control logic 240 initiates copying a subsection of data (corresponding to the current subsection address portion) from the section buffer 230 to the controller 100 and/or the host system 30 without copying a section of data from the non-volatile memory cell array 210 to the section buffer 230. While the logic circuit is illustrated as including inverter 119 and AND gate 121, functionality of the logic circuit may be provided using other circuit elements such as NAND, OR, and/or NOR gates.

When the current and previous section address portions are different, the comparator may generate a binary "L" (or "0") value so that the signal SARS has a binary "L" value and the WAIT signal has a binary "H" (or "1") value. Stated in other words, the WAIT signal may be enabled at the controller 100 so that the host clock signal HOST CLK is blocked from the CPU 123 by the masking logic circuit (for example, including inverter 119 and AND gate 121). An asynchronous read operation may thus be provided at a relatively slow speed when successive read operations specify different section address portions to allow time to copy the new section of data from the non-volatile memory cell array 210 to the section buffer 230.

After copying the section of data from the non-volatile memory cell array 200 to the section buffer 230 and before copying the sub-section of the data from the section buffer 230 to the controller 100 and/or the host, the WAIT signal may be disabled at the controller 100 so that the WAIT signal has a binary "L" (or "0") value. More particularly, the WAIT signal may be disabled by copying the current section address portion into the register 252 so that the comparator 254 is now comparing the current section address portion at both inputs thereof so that the clock signal from the host system 30 is no longer masked from the CPU 123 of the controller 100. A subsection of the data from the section buffer 230 defined by the current subsection address portion can then be copied from the section buffer 230 to the controller 100 and/or the host system 30. The current section address portion may thus be copied into the register 252 before initiating a subsequent read operation.

As shown in FIG. 3, the SARS signal may be combined with read operation signal nRF at logic gate 258 (such as a NOR gate) to generate the WAIT signal. During a read operation, the read operation signal nRF may have a binary "L" value, and otherwise, the read operation signal nRF may have a binary "H" value. With the read operation signal nRF having a binary "L"[1] value, the WAIT signal may be generated as an inverse of the SAKS signal. With the read operation signal if U having a binary "H" value, the WAIT signal may be disabled (i.e., a binary "L" value) regardless of a value of the SARS signal.

As further shown in FIG. 3 an output of the comparator 254 may be combined with INIF signal at logic gate 256 (such as an AND gate) to generate the SARS signal. In particular, controller 100 and/or control logic 240 may generate INIF signal having a binary "H" value during normal operations. If a current read operation is a first read operation after providing power to the memory device, however, the INIF signal may be generated at a binary "L" value so that the SARS signal is forced to the binary "L" value to force an asynchronous read operation. When the memory block 200 is initially powered up, no meaningful data will be stored in the section buffer 230 or in the register 252 until after a first read operation is performed. By using the INIF signal to disable synchronous read operations after initial power up until after a first asynchronous read operation, meaningful data may be stored in the section buffer 230 and in the register 252 before allowing synchronous read operations.

Figure 4:
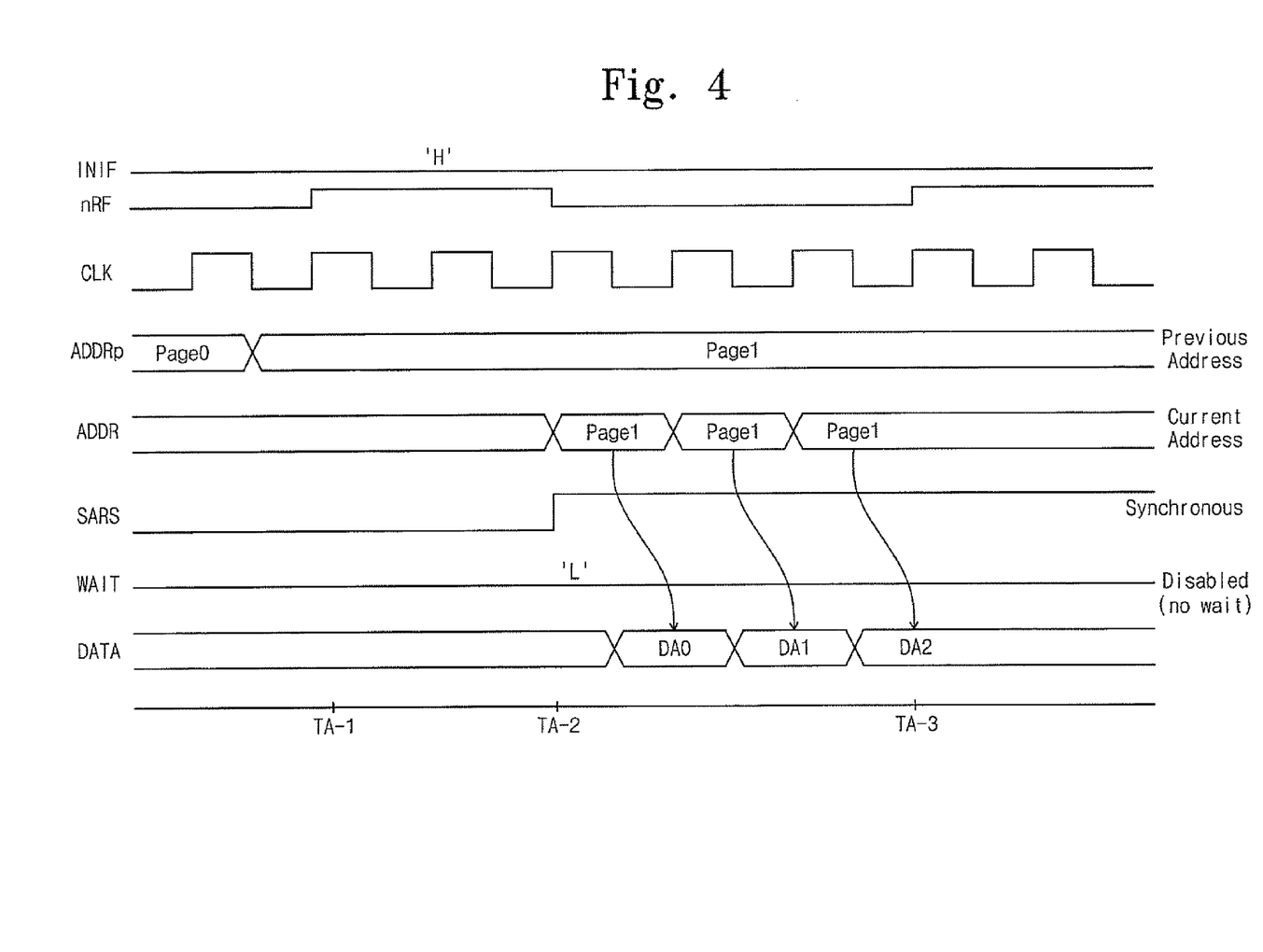
FIGS. 4 and 5 are timing diagrams illustrating read operations according to embodiments of the present invention.
Figure 5:
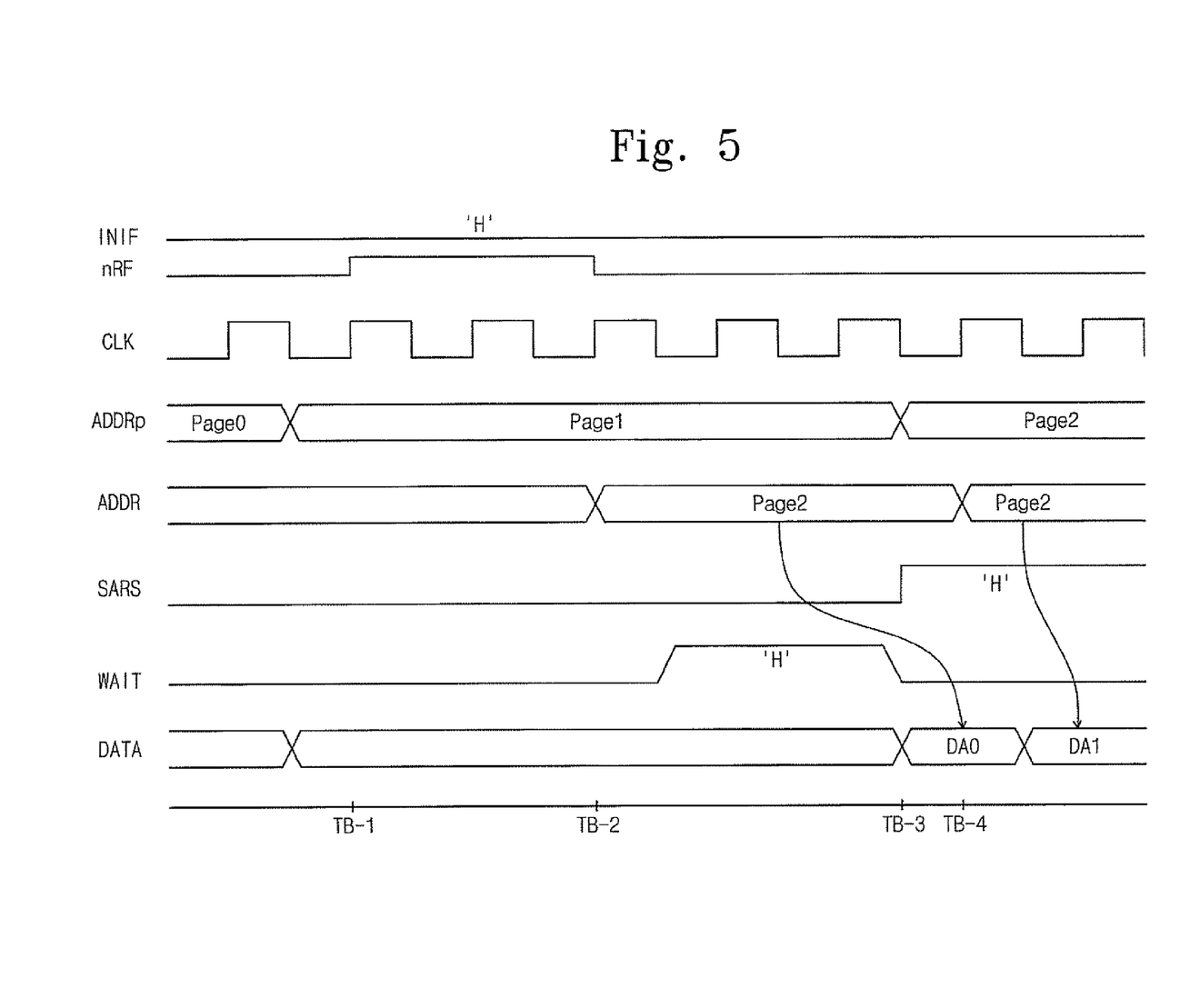

Synchronous and asynchronous read operations will now be discussed with respect to the timing diagrams of FIGS. 4 and 5. More particularly, FIG. 4 is a timing diagram illustrating successive read operations sharing a same section address portion so that the read operations may be performed synchronously. FIG. 5 is a timing diagram illustrating successive read operations having different section address portions so that the read operations are performed asynchronously.

In FIGS. 4 and 5, the clock signal CLK received at the control logic 240 may be derived from the host clock signal HOST CLK from the host system 30 without blocking from the AND gate 121 used mask the host clock signal HOST CLK from the memory controller 100 CPU 123. Accordingly, the clock signal CLK may be provided to the control logic regardless of a value of the WAIT signal.

The previous section address portion ADDRp stored in the register 252 may be the section address portion from a most recent previous read operation so that the previous section address portion defines a section of data from the previous read operation stored in the section buffer 230. The current section address portion ADDR received from the memory controller 100 may be a section address portion for a current read operation defining a section of data for the current read operation. The INIF signal and the nRF signal may be generated by the control logic 240 as discussed above, and the SARS signal and the WAIT signal may be generated by the address comparing circuit 250.

In particular, the control logic 240 may generate the INIF signal having the binary "H" value indicating that a read operation has been performed since the memory block 200 was most recently powered up. With the INIF signal having the binary "H" value, a previous section address portion stored in the register 252 defines a section address of non-volatile memory cell array 210 corresponding to the section of data stored in the section buffer 230. Stated in other words, the section of data stored in the section buffer 230 is the same as the section of data stored in the section of non-volatile memory cell array 210 defined by the previous section address portion stored in the register 252. Accordingly, the SARS signal may be enabled/disabled responsive to an output of comparator 254 to allow synchronous and/or asynchronous read operations responsive to an output of the comparator 254. If the INIF signal has the binary "L" value, only asynchronous read operations may be allowed.

FIGS. 4 and 5 are timing diagrams illustrating read operations according to embodiments of the present invention. More particularly, FIG. 4 illustrates synchronous read operations according to embodiments of the present invention, while FIG. 5 illustrates asynchronous read operations according to embodiments of the present invention.

As shown in FIG. 4, before time TA-1, a most recent previous read operation may be performed using a previous section address portion Page1 so that the previous section address portion Page1 may be stored in the register 252 after time TA-1, and so that the section of data from the section of non-volatile memory cell array 200 defined by the previous section address portion Page1 may be stored in the section buffer 230 after time TA-1. From time TA-1 to TA-2, the nRF signal has a binary "H" value indicating that no read operations are to be performed. Control logic 240, for example, may generate the nRF signal responsive to command signals CMD received from the memory controller 100.

At time TA-2, a series of synchronous read operations may be initiated responsive to the falling edge of the nRF signal, the clock signal CLK, and the current address ADDR received from the memory controller 100. As discussed above, each address ADDR received from the memory controller 100 may include a section address portion and a subsection address portion. Only the section address portions are shown in the timing diagram of FIG. 4 because only the section address portions are used to determine whether a synchronous or asynchronous read operation may be performed.

At time TA-2 of FIG. 4, the section address portion Page1 of the previous address ADDRp from the register 252 is compared with the section address portion Page1 of a first current address ADDR from the memory controller 100. Because the previous and current section address portions are the same (i.e., Page1), the SARS signal transitions from a binary "L" value to a binary "H" value at time TA-2 while the WAIT signal is maintained at the binary "L" value. A first current read operation may thus be performed during a first cycle of the clock signal CLK after the falling edge of the nRF signal to copy a first subsection of data DA0 (defined by a subsection portion of the first current address ADDR) from the section buffer 230 to the memory controller 100 and/or the host system 30 without masking the host clock signal HOST CLK from the CPU 123.

Second and third successive current read operations may then be performed with respective second and third current addresses ADDR having same section address portions (i.e., Page1) but different subsection address portions. The second current read operation may be performed during a second cycle of the clock signal CLK after the falling edge of the nRF signal to copy a second subsection of data DA1 (defined by a subsection portion of the second current address ADDR) from the section buffer 230 to the memory controller 100 and/or the host system 30 without masking the host clock signal HOST CLK from the CPU 123. The third current read operation may be performed during a third cycle of the clock signal CLK after the falling edge of the nRF signal to copy a third subsection of data DA2 (defined by a subsection portion of the third current address ADDR) from the section buffer 230 to the memory controller 100 and/or the host system 30 without masking the host clock signal HOST CLK from the CPU 123.

Upon completion of the third current read operation at block TA-3, the nRF signal may transition from the binary "L" binary to the binary "H" value. Moreover, the same previous section address portion Page1 may remain stored in the register 252, and the same section of data (corresponding to the previous section address portion Page 1) may remain stored in the section buffer 230. Moreover, during the three synchronous read operations from time TA-2 to TA-3, the WAIT signal may remain disabled at the binary "L" value so that the host clock signal HOST CLK is not masked from the CPU 123 during the three synchronous read operations.

As shown in FIG. 5, before time TB-1, a most recent previous read operation may be performed using a previous section address portion Page1 so that the previous section address portion Page1 may be stored in the register 252 after time TB-1, and so that the section of data from the section of non-volatile memory cell array 200 defined by the previous section address portion Page1 may be stored in the section buffer 230 after time TB-1. From time TB-1 to TB-2, the nRF signal has a binary "H" value indicating that no read operations are to be performed. Control logic 240, for example, may generate the nRF signal responsive to command signals CMD received from the memory controller 100.

At time TB-2, an asynchronous read operation may be initiated responsive to the falling edge of the nRF signal, the clock signal CLK, and the current address ADDR received from the memory controller 100. As discussed above, each address ADDR received from the memory controller 100 may include a section address portion and a subsection address portion. Only the section address portions are shown in the timing diagram of FIG. 5 because only the section address portions are used to determine whether a synchronous or asynchronous read operation may be performed.

At time TB-2 of FIG. 5, the section address portion Page1 of the previous address ADDRp from the register 252 is compared with the section address portion Page2 of a first current address ADDR from the memory controller 100. Because the previous and current section address portions are different (i.e., Page1 is not equal to Page2), the SARS signal is maintained at a binary "L" value while the WAIT signal transitions from a binary "L" value to a binary "H" value. The WAIT signal may thus be enabled at the memory controller 100 so that the host clock signal HOST CLK is masked from the CPU 123 while an asynchronous read operation is performed at memory block 200. Accordingly, an asynchronous read operation may be performed between time TB-2 and time TB-4 over multiple cycles of the clock signal CLK. Moreover, the host clock signal HOST CLK may be masked from the CPU 123 while the clock signal CLK is maintained at the memory block 200.

With the enabled WAIT signal having the binary "H" value, a section of data defined by the section address portion Page2 of the first current address ADDR is copied from the non-volatile memory cell array 210 to the section buffer 230 while the host clock signal HOST CLK is masked from the CPU 123. Once the section of data is copied to the section buffer 230, the section address portion Page2 of the current address ADDR is copied into the register 252 at time TB-3. Accordingly, the output of the comparator and the SARS signal transition to a binary "H" value, and the WAIT signal transitions to the binary "L" value at time TB-3. In addition, a first subsection of data DA0 (defined by a subsection portion of the first current address ADDR) from the section buffer 230 is copied to the memory controller 100 and/or the host system 30. A first current read operation may thus be performed asynchronously during multiple cycles of the clock signal CLK after the falling edge of the nRF signal to copy a first subsection of data DA0 (defined by a subsection portion of the first current address ADDR) from the section buffer 230 to the memory controller 100 and/or the host system 30 while masking the host clock signal HOST CLK from the CPU 123.

A second current read operations may then be performed synchronously with a second current address ADDR having a same section address portions (i.e., Page2) but a different subsection address portion. The second current read operation may be performed during a cycle of the clock signal CLK beginning at time TB-4 to copy a second subsection of data DA1 (defined by a subsection portion of the second current address ADDR) from the section buffer 230 to the memory controller 100 and/or the host system 30 without masking the host clock signal HOST CLK from the CPU 123. Subsequent read operations may be performed synchronously or asynchronously depending on whether the section address portions of addresses for previous and current read operations are the same or different.

Figure 6:
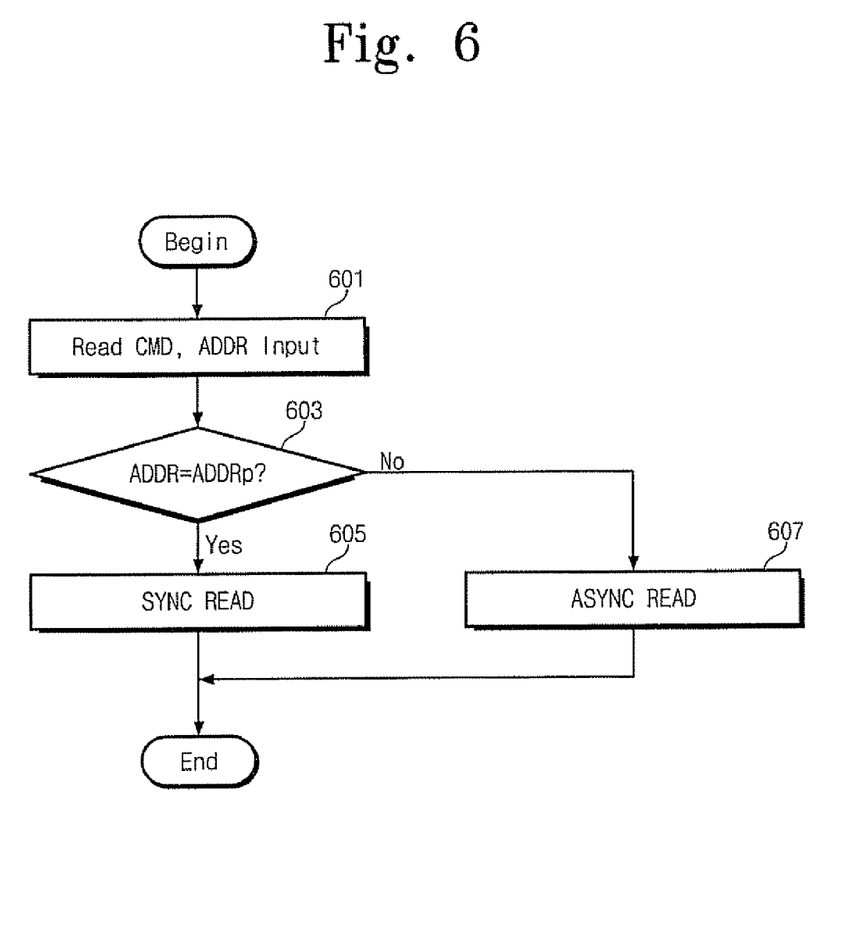
FIG. 6 is a flow chart illustrating read operations according to embodiments of the present invention.

FIG. 6 is a flow chart illustrating read operations according to embodiments of the present invention. The control logic 240 may initiate a read operation at block 601 in response to a read command and an input address received as command CMD and address ADDR information from the memory controller 100 and/or the host system 30. As noted above, a section portion of an address for a previous read operation may be stored in the register 252 of the address comparing circuit 250. If the sections portions of addresses for the previous and current read operations are the same at block 603, a synchronous read operation may be performed at block 605 as discussed above with respect to FIG. 4, If the sections portions of addresses for the previous and current read operations are different at block 603, an asynchronous read operation may be performed at block 607 as discussed above with respect to FIG. 5.

According to some embodiments of the present invention, the memory block 200 and the memory controller 100 may be separately fabricated on different semiconductor substrates, and then assembled. The memory block 200 and the memory controller 100, for example, may be separately fabricated and then assembled on a same printed circuit board, and/or semiconductor substrates of the memory block 200 and the memory controller 100 may be stacked.

Figure 7:
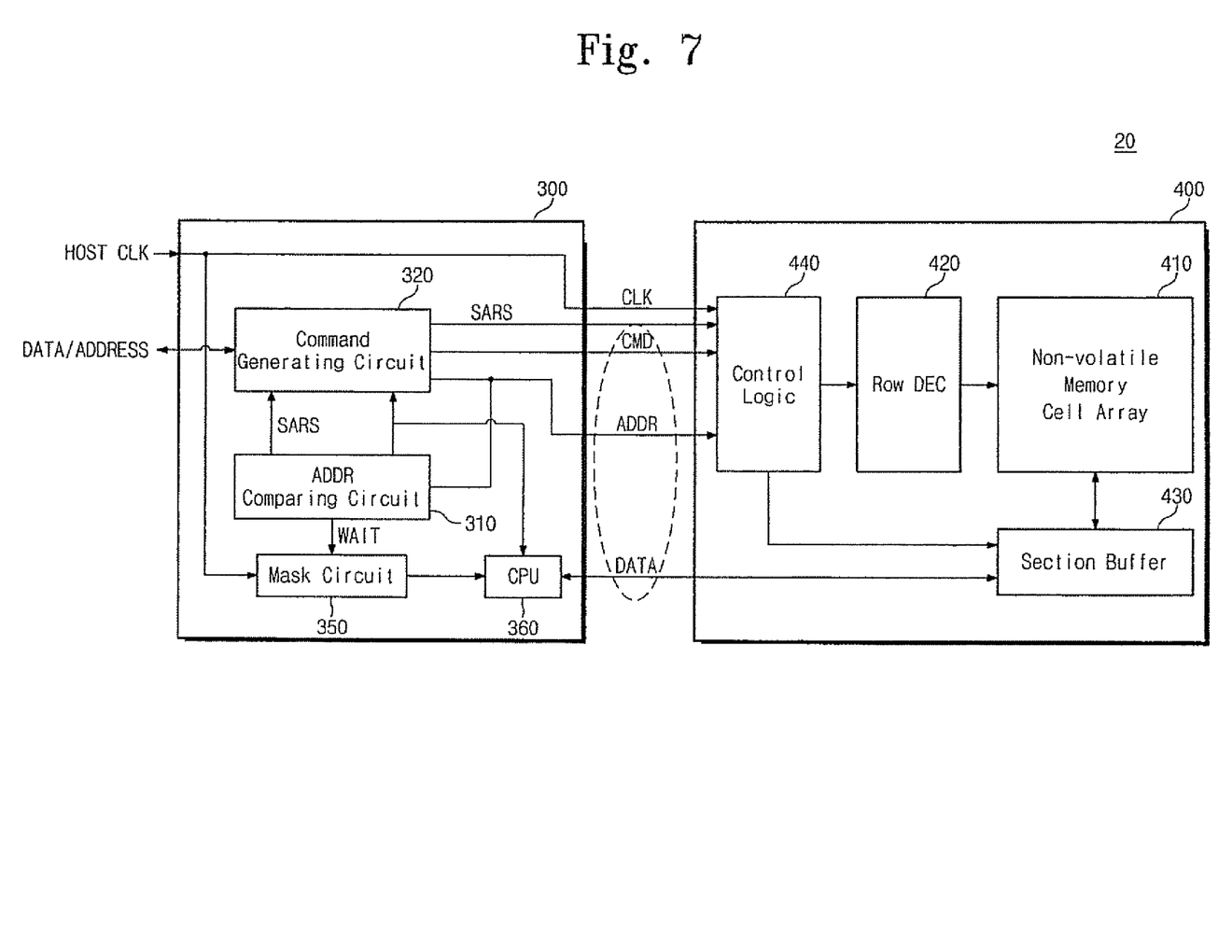
FIG. 7 is a block diagram illustrating electronic memory systems according to still other embodiments of the present invention.

According to other embodiments of the present invention, a memory controller 300 and a memory block 400 may be fabricated on a same semiconductor substrate as shown in FIG. 7. In addition, an address comparing circuit 310 may be provided as a portion of the memory controller 300. Otherwise the memory block 400 and the memory controller 300 may provide read operations as discussed above with respect to FIGS. 1-6. In FIG. 7, the host clock signal HOST CLK and data and address information DATA/ADDRESS may be received from a host system. Command generating circuit 230 may transmit command and address information CMD and ADDR to control logic 440 of the memory block 400, and the row decoder 420, the non-volatile memory cell array 410, and the section buffer 430 of the memory block 400 may operate as discussed above with respect to FIGS. 1-6.

The address comparing circuit 310 of the memory controller 300 may generate the WAIT and SARS signals as discussed above with respect to the address comparing circuit 250 of FIG. 1 by comparing section portions of addresses for previous and current read operations. Moreover, the mask circuit 350 may mask the host clock signal HOST CLK from the CPU 360 (central processing unit) responsive to the WAIT signal generated by the address comparing circuit 310 during an asynchronous read operation. At other times (including during synchronous read operations), the mask circuit 350 allows the host clock signal HOST CLK to pass through to the CPU 350. The mask circuit 350, for example, may include an inverter and an AND gate as discussed above with respect to FIG. 1.

Figure 8:
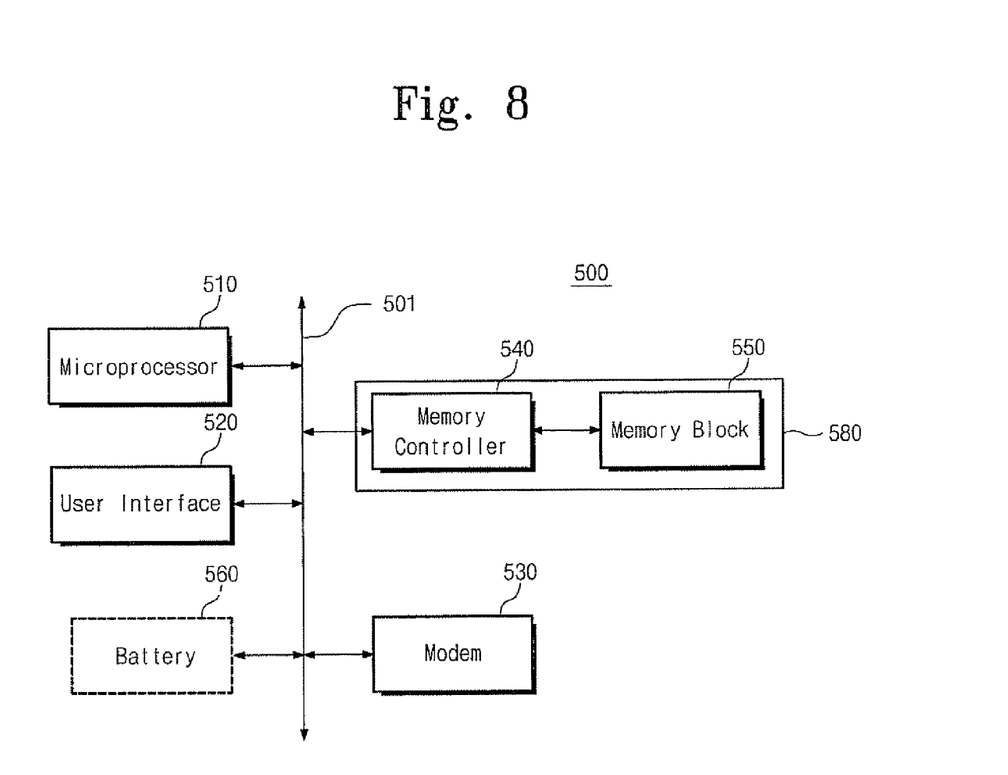
FIG. 8 is a block diagram illustrating systems including electronic memory systems according to embodiments of the present invention.

FIG. 8 is a block diagram of a portable and/or wireless electronic device 500 including nonvolatile flash memory according to embodiments of the present invention. The electronic device 500, for example, may include a microprocessor 510, a user interface 520, a battery 560, and/or a modem 530 coupled over a bus 501. In addition, a nonvolatile flash memory device 580 may be coupled to the bus 501. More particularly, the nonvolatile flash memory device 580 may be implemented according to embodiments of the present invention as discussed above with respect to FIGS. 1 and/or 7. The memory controller 540 may be implemented as discussed above with respect to the memory controller 100 of FIG. 1, and the memory block 550 may be implemented as discussed above with respect to the memory block 200 of FIG. 1. According to other embodiments of the present invention, the memory controller 540 may be implemented as discussed above with respect to the memory controller 300 of FIG. 7, and the memory block 550 may be implemented as discussed above with respect to the memory block 400 of FIG. 7.

The electronic device 500 may be a hand held or laptop computer, a personal digital assistant, a digital audio/video player/recorder, a radiotelephone (with inclusion of a transceiver), a positioning/mapping, device (with inclusion of a positioning receivers such as a GPS receiver), etc. Moreover, the nonvolatile flash memory device 580 may be permanently installed in the electronic device 500, or the nonvolatile flash memory device 580 may be detachably coupled to the bus 501 so that the memory device 580 may be inserted into and removed from the electronic device 500.

While the present invention has been particularly shown and described with reference to embodiments thereof it will be understood by those of ordinary skill in the art that various changes in form and details may be made therein without departing from the spirit and scope of the present invention as defined by the following claims.

The invention claimed is:

1. A method of operating a memory device including a memory cell array arranged in a plurality of sections of memory cells, with each section of memory cells including a plurality of sub-sections of memory cells, the method comprising:
providing a current memory address for a current read operation from a controller, wherein the current memory address includes a current section address portion and a current sub-section address portion;
comparing the current section address portion and a previous section address portion of a previous read operation;
when the current and previous section address portions are different, enabling a wait signal at the controller;
while enabling the wait signal at the controller, copying a section of data from the memory cell array to a section buffer wherein the section of data is copied from a section of memory cells defined by the current section address portion of the current memory address; and
after copying the section of data to the section buffer, transmitting a sub-section of the data from the section of data in the section buffer to the controller.

2. A method according to claim 1 further comprising:
after copying the section of data to the section buffer and before transmitting the sub-section of the data, disabling the wait signal at the controller.

3. A method according to claim 1 further comprising:
when the current and previous section address portions are the same, disabling the wait signal; and
maintaining a section of data from the previous read operation in the section buffer and transmitting a sub-section of the data in the section buffer while disabling the wait signal at the controller.

4. A method according to claim 3 further comprising:
responsive to enabling the wait signal, masking a clock signal at the controller when the previous section address portion and the current section address portion are different; and responsive to disabling the wait signal, unmasking the clock signal at the controller when the previous section address portion and the current section address portion are the same.

5. A method according to claim 4 wherein masking the clock signal comprises combining the enabled wait signal with an input clock signal at a logic gate so that no clock signal is provided at an output of the logic gate responsive to enabling the wait signal, and wherein unmasking the clock signal comprises combining the disabled wait signal with the input clock signal at the logic gate and so that an output clock signal is provided at the output of the logic gate responsive to disabling the wait signal.

6. A method according to claim 5 wherein the logic gate comprises an AND gate, a NAND gate, an OR gate, and/or a NOR gate.

7. A method according to claim 1 wherein each section of memory cells in the memory cell array comprises a page of memory cells, and wherein each sub-section of memory cells comprises a byte of memory cells.

8. A method according to claim 1 further comprising:
before providing the current memory address for the current read operation, saving the previous section address portion of the previous read operation in a previous address register; and
when the current and previous section address portions are different, copying the current section address portion to the previous address register.

9. A method according to claim 1 wherein the memory cell array comprises an integrated circuit memory cell array on a semiconductor substrate, wherein comparing the current and previous section address portions comprises comparing the current and previous section address portions using a comparison circuit, and wherein the comparison circuit is provided on the semiconductor substrate.

10. A method according to claim 1 wherein the memory cell array comprises a plurality of strings of memory cells with each string including a plurality of memory cell transistors serially coupled between a string selection transistor and a ground selection transistor.

11. A method according to claim 10 wherein a section of memory cells of the memory cell array includes a plurality of memory cell transistors of different strings electrically coupled to a same wordline.

12. A method according to claim 1 wherein the memory cell array comprises a plurality of memory cell transistors arranged in rows and columns, wherein each memory cell transistor is electrically coupled between a bit line and a source line, and wherein a control electrode of each memory cell transistor is electrically coupled to a wordline.

13. A method according to claim 12 wherein a section of memory cells of the memory cell array includes a plurality of memory cell transistors having control electrodes electrically coupled to a same wordline.

14. A method according to claim 1 further comprising:
determining if the current read operation is a first read operation after providing power to the memory device;
when the current read operation is a first read operation after providing power to the memory device, enabling the wait signal at the controller;
while enabling the wait signal at the controller, copying a section of data from the memory cell array to a section buffer wherein the section of data is copied from a section of memory cells defined by the current section address portion of the current memory address; and
after copying the section of data to the section buffer, transmitting a sub-section of the data from the section of data in the section buffer to the controller.

15. An electronic device comprising:
a memory cell array arranged in a plurality of sections of memory cells, with each section of memory cells including a plurality of sub-sections of memory cells;
a section buffer electrically coupled to the memory cell array, wherein the section buffer is configured to store a section of data read from a section of memory cells of the memory cell array; and
a controller electrically coupled to the memory cell array and the section buffer, wherein the controller is configured to receive a current memory address for a current read operation from a memory controller with the current memory address including a current section address portion and a current sub-section address portion, and to mask a clock signal at the controller when the current section address portion and a previous section address portion from a previous read operation are different;
wherein the section buffer is configured to copy a section of data from the memory cell array while the clock signal of the memory controller is masked, wherein the section of data is copied from a section of memory cells defined by the current section address portion of the current memory address;
wherein the section buffer is configured to transmit a sub-section of the data from the section of data in the section buffer after the section of data is copied to the section buffer.

16. An electronic device according to claim 15 further comprising:
a comparison circuit electrically coupled to the controller, wherein the comparison circuit is configured to compare the current section address portion with the previous section address portion of a previous read operation.

17. An electronic device according to claim 16 wherein the comparison circuit is configured to enable or disable a wait signal responsive to comparing the current and previous section address portions, and wherein the controller is configured to mask or unmask the clock signal responsive to the wait signal.

18. An electronic device according to claim 16 wherein the memory cell array comprises an integrated circuit memory cell array on a semiconductor substrate, and wherein the comparison circuit is provided on the semiconductor substrate.

19. An electronic device according to claim 15 wherein the memory cell array comprises a plurality of strings of memory cells with each string including a plurality of memory cell transistors serially coupled between a string selection transistor and a ground selection transistor.

20. An electronic device according to claim 15 further comprising:
a bus electrically coupled to the controller;
a microprocessor electrically coupled to the bus, wherein the controller is configured to provide data from the memory cell array over the bus to the microprocessor.

21. An electronic device according to claim 20 further comprising:
a user interface electrically coupled to the bus, wherein the user interface is configured to provide data to the microprocessor and to receive data from the microprocessor.

22. An electronic device comprising:
a memory cell array arranged in a plurality of strings of memory cells with each string including a plurality of memory cell transistors serially coupled between a string selection transistor and a ground selection transistor with a plurality of memory cell transistors of different strings defining a section and with each section including a plurality of sub-sections of memory cells transistors;
a section buffer electrically coupled to the memory cell array, wherein the section buffer is configured to store a section of data read from a section of memory cells of the memory cell array; and
a controller electrically coupled to the memory cell array and the section buffer, wherein the controller is configured to receive a current memory address for a current read operation with the current memory address including a current section address portion and a current sub-section address portion, and to mask a clock signal at the controller when the current section address portion and a previous section address portion from a previous read operation are different;
wherein the section buffer is configured to copy a section of data from the memory cell array while the clock signal of the memory controller is masked, wherein the section of data is copied from a section of memory cells defined by the current section address portion of the current memory address;
wherein the section buffer is configured to transmit a sub-section of the data from the section of data in the section buffer after the section of data is copied to the section buffer.

23. An electronic device according to claim 22 further comprising:
a comparison circuit electrically coupled to the controller, wherein the comparison circuit is configured to compare the current section address portion with a previous section address portion of a previous read operation.

24. An electronic device according to claim 23 wherein the comparison circuit is configured to enable or disable a wait signal responsive to comparing the current and previous section address portions, and wherein the controller is configured to mask or unmask the clock signal responsive to the wait signal.

25. An electronic device according to claim 23 wherein the memory cell array comprises an integrated circuit memory cell array on a semiconductor substrate, and wherein the comparison circuit is provided on the semiconductor substrate.

* * * * *